US012609660B2

(12) United States Patent
Dubey et al.

(10) Patent No.: US 12,609,660 B2
(45) Date of Patent: Apr. 21, 2026

(54) DYNAMIC PULSE WIDTH CONTROL SCHEME IN AMPLIFIERS

(71) Applicant: TEXAS INSTRUMENTS INCORPORATED, Dallas, TX (US)

(72) Inventors: Sumit Dubey, Bangalore (IN); Rejin Kanjavalappil Raveendranath, Bangalore (IN); Shaik Asif Basha, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 598 days.

(21) Appl. No.: 18/088,091

(22) Filed: Dec. 23, 2022

(65) Prior Publication Data

US 2024/0213935 A1 Jun. 27, 2024

(51) Int. Cl.
*H03F 3/217* (2006.01)
*H03F 1/32* (2006.01)

(52) U.S. Cl.
CPC ......... *H03F 3/2173* (2013.01); *H03F 1/3205* (2013.01); *H03F 2200/03* (2013.01); *H03F 2200/351* (2013.01)

(58) Field of Classification Search
CPC .. H03F 3/2173; H03F 1/3205; H03F 2200/03; H03F 2200/351; H03F 3/45475
USPC ........................................ 330/251, 10, 207 A
See application file for complete search history.

(56) References Cited

U.S. PATENT DOCUMENTS 11,595,039 B2 * 2/2023 Gallo ...................... H02M 1/08
11,955,890 B2 * 4/2024 Liao ......................... H02M 1/38

* cited by examiner

*Primary Examiner* — Hieu P Nguyen
(74) *Attorney, Agent, or Firm* — Xianghui Huang; Frank D. Cimino

(57) ABSTRACT

Examples of amplifiers and components thereof are configured to adjust the OFF-pulse widths of a high-duty cycle pulse width modulated (PWM) output signal and the ON-pulse widths of a low-duty cycle PWM output signal. Such control is carried out using high- and low-side (HS and LS) detectors. The HS detector coupled to the control terminal of an HS transistor detects when the gate-to-source voltage (Vgs) of the HS transistor drops below a threshold and outputs an HS detection signal to adjust the OFF-pulse widths of the high-duty cycle PWM output signal. An LS detector coupled to the control terminal of an LS transistor detects when the Vgs of the LS transistor drops below the threshold and outputs a LS detection signal to adjust the ON-pulse widths of the low-duty cycle PWM output signal.

20 Claims, 7 Drawing Sheets

302

302

700

702

PWM_P

HSFB_P

OUTP

DYNAMIC PULSE
WIDTH BASED ON
HSFB_P FEEDBACK

704

PWM_N

LSFB_N

OUTN

DYNAMIC PULSE
WIDTH BASED ON
LSFB_N FEEDBACK

DYNAMIC PULSE WIDTH CONTROL SCHEME IN AMPLIFIERS

FIELD OF DISCLOSURE

This disclosure relates to dynamically controlling the pulse widths of output signals of an amplifier to deliver quality audio at maximum power, and more particularly to maximizing pulse widths of output signals of a Class-D amplifier across multiple process, temperature and power supply corners for delivering distortion-free peak power.

BACKGROUND

In a conventional audio Class-D amplifier, its output stage often adds non-linearity in the loop filter for very narrow pulse width signals (~10 ns-100 ns). This non-linearity tends to lead to total harmonic distortion plus noise (THDN) degradation for the amplifier. With BD modulation (which minimizes switching current), narrow pulse widths can exist at high audio input near supply saturation (>99% duty cycle on one side and <1% duty cycle on the other side), which may lead to THDN degradation at maximum power delivery. With LSR modulation, narrow pulse widths can be found near idle channel low audio amplitude (<1% duty cycle), which can lead to high audio noise for low amplitude signals. At high audio input near supply saturation (>99% duty cycle), narrow pulse widths can lead to THDN degradation at maximum power delivery using LSR modulation.

One previous approach to addressing these issues for both types of narrow pulse widths is to add a minimum pulse width generator downstream of the modulation block and upstream of the pre-driver and output stage. Such minimum pulse width generator is configured to ensure that each OFF period between adjacent ON periods at high (>90%) duty cycle has a sufficiently large width, and at low (<1%) duty cycle each of ON periods between adjacent OFF periods has a sufficient large pulse width. This minimum pulse width generator generally protects the loop filter from very high nonlinearity being added by the output stage. However, by adding additional pulse width for very narrow pulse width signal, the minimum pulse width generator adds additional differential as well as common mode error in loop filter. Moreover, at high (~95%) duty cycle, the inserted pulses negatively impact maximum power delivery with THDN>80 dB at a fixed supply.

A better solution to these narrow pulse width issues is desirable. In particular, a control scheme is needed that ensures that each narrow pulse width is greater than the minimum pulse width required by the output stage to complete the output transition. In this context, embodiments of the invention arise.

SUMMARY

In an example, an amplifier comprises high- and low-side transistors, each having a control terminal and first and second current terminals, in which the first current terminal of the low-side transistor is coupled to the second current terminal of the high-side transistor. Such amplifier also comprises high- and low-side pre-drivers having respective high- and low-side inputs and respective high- and low-side outputs. The high-side input is configured to receive a first input signal, and the high-side output is coupled to the control terminal of the high-side transistor. The low-side input is configured to receive a second input signal, and the low-side output is coupled to the control terminal of the low-side transistor. High- and low-side detection circuits are also included. The high-side detection circuit has an input coupled to the control terminal of the high-side transistor, and is configured to output a high-side feedback signal. The low-side detection circuit has an input coupled to the control terminal of the low-side transistor, and is configured to output a low-side feedback signal.

In an example, an amplifier comprises a modulator and an output stage. The modulator is configured to receive first and second input signals, output first and second pulse width modulated (PWM) signals, and receive first and second feedback signals. The output stage is coupled to the modulator and includes a signal node. The output stage is configured to receive the first and second PWM signals, and output the first and second feedback signals.

In an example, a method of adjusting pulse width of output signals of an amplifier having an output stage is provided. The method comprises detecting that a gate-to-source voltage (Vgs) of a transistor of the output stage is less than a voltage threshold in response to a pulse width modulated (PWM) signal input to the output stage; outputting a feedback signal at a specific level in response to detecting that the Vgs of the transistor is less than the voltage threshold; and adjusting one of: each pulse low width or each high pulse width of a PWM output signal of the amplifier in response to the feedback signal.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
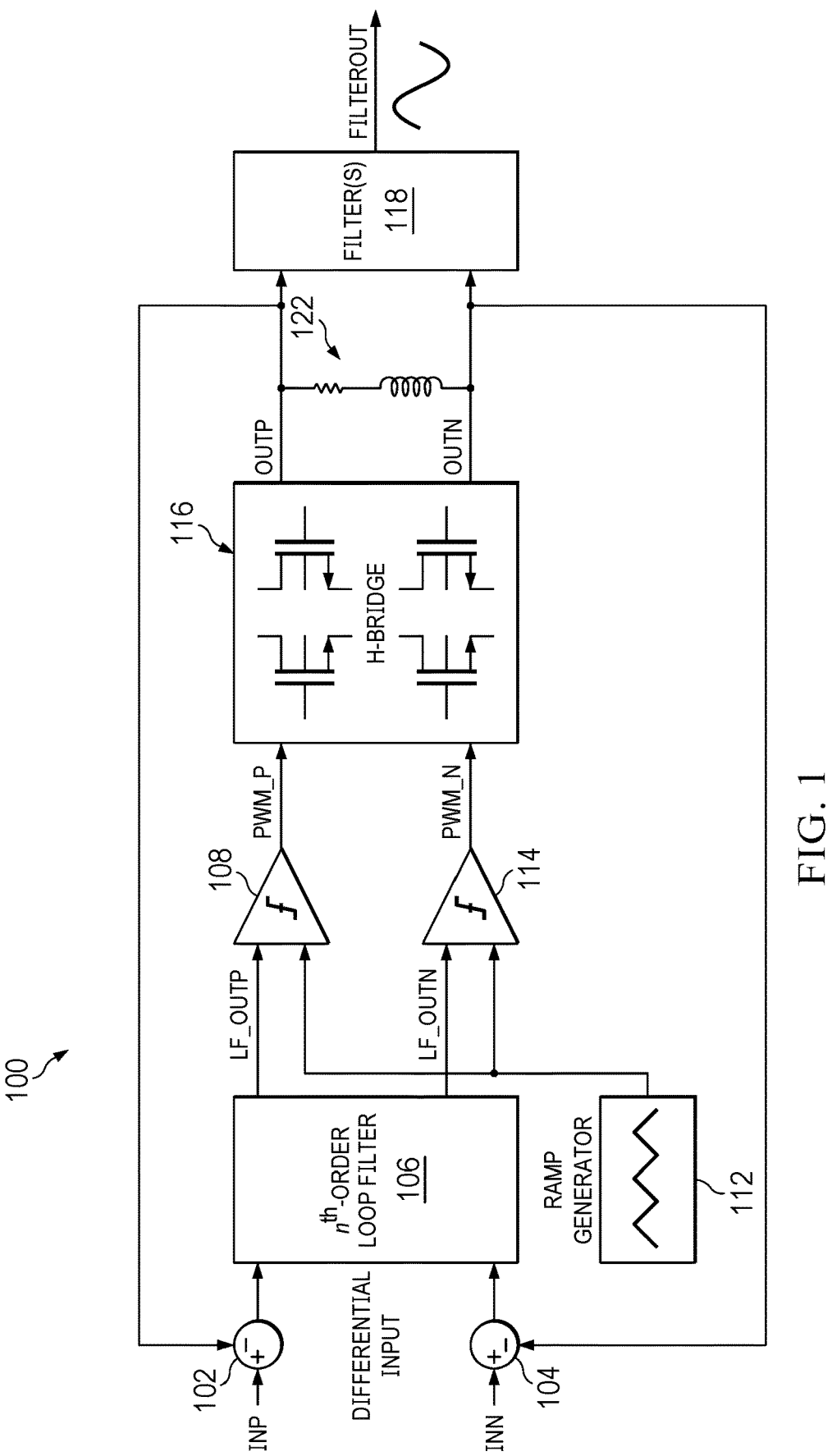
FIG. 1 is a block diagram of an example Class-D amplifier.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

Examples of amplifiers and components thereof are configured to adjust the OFF-pulse widths of a high-duty cycle pulse width modulated (PWM) output signal and the ON-pulse widths of a low-duty cycle PWM output signal. Such control is carried out using high- and low-side (HS and LS) detectors. The HS detector coupled to the control terminal of an HS transistor detects when the gate-to-source voltage (Vgs) of the HS transistor drops below a threshold and outputs an HS detection signal to adjust the OFF-pulse widths of the high-duty cycle PWM output signal. An LS detector coupled to the control terminal of an LS transistor detects when the Vgs of the LS transistor drops below the threshold and outputs a LS detection signal to adjust the ON-pulse widths of the low-duty cycle PWM output signal. In an example configuration, the source of the HS transistor is coupled to the drain of the LS transistor to define a signal node. Under a first load current condition, the signal at the signal node transitions from high-to-low, during which the HS transistor operates in the Miller region, and the HS detection signal detects the completion of the signal transition and the exit of the HS transistor from the Miller region operation to OFF. Under a second load current condition, the signal at the signal node transitions from low-to-high, during which the LS transistor operates in the Miller region, and the LS detection signal detects the completion of the signal transition and the exit of the LS transistor from the Miller region operation to OFF. Such structure and operating techniques enable pulse widths to be adjusted to deliver maximum or near maximum power across a range of operating conditions and process corners.

FIG. 1 is a diagram of example Class-D amplifier 100, which receives a differential input signal. A pair of subtractors 102 and 104 subtract differential output components OUTP and OUTN from differential input components INP and INN, respectively. The resulting signals output from subtractors 102 and 104 are provided to an $n^{th}$-order loop filter (or simply loop filter) 106, where n is an integer typically of 3 or greater. Each component of the differential signal input to loop filter 106 may be integrated over an $n^{th}$-order integration function comprised of a chain of n integrators coupled in series. The outputs of each of the n integrators are used to generate, via summers within loop filter 106, pulse width modulated (PWM) signals LF_OUTP and LF_OUTN.

The LF_OUTP signal is input to a comparator 108 that also receives a signal from a ramp generator 112. The output of ramp generator 112 may be a triangular carrier signal. Comparator 108 compares the ramp generated signal with LF_OUTP to generate signal PWM_P. The LF_OUTN signal is input to comparator 112 that also receives the ramp generator signal. Based on a comparison of the two input signals, comparator 112 generates signal PWM_N.

PWM_P and PWM_N are used to drive a switching output stage, which may be in the form of, or include, an H-bridge 116. The outputs of H-bridge 116 (OUTP and OUTN), are input to downstream filter(s) 118, in addition to being fed back to subtractors 102 and 104, respectively. An inductor-resistor (LR) series circuit 122, which models an audio speaker, is coupled between the outputs of H-bridge 116. The output of filter(s) 118, which is also the output of amplifier 100, is denoted FILTEROUT.

To better control the output signals OUTP and OUTN, and in particular to ensure that in the positive half-cycles of time-varying signal OUTP/N the pulse widths between ON pulses of OUTP do not fall below a minimum pulse width (DMAX) and that the pulse widths between OFF pulses of OUTN do not fall below a minimum pulse width (DMIN), Class-D amplifier 100 is configured to provide a high-side feedback signal (HSFB_P) and a low-side feedback signal (LSFB_N) to a modulator. To better control OUTP and OUTN in the negative half-cycles, high-side feedback signal (HSFB_N) is used with respect to OUTN and low-side feedback signal (HSFB_N) is used with respect to OUTP for determining their DMAX and DMIN, respectively. For simplicity, the feedback techniques of determining DMAX and DMIN are described primarily in the context of the positive half-cycles of OUTP/N, although it is to be understood that the feedback techniques also apply to the negative half-cycles as indicated herein. Also, in some instances the high-side feedback signal and low-side feedback signal are referred to simply as HSFB and LSFB, respectively.

Figure 2:
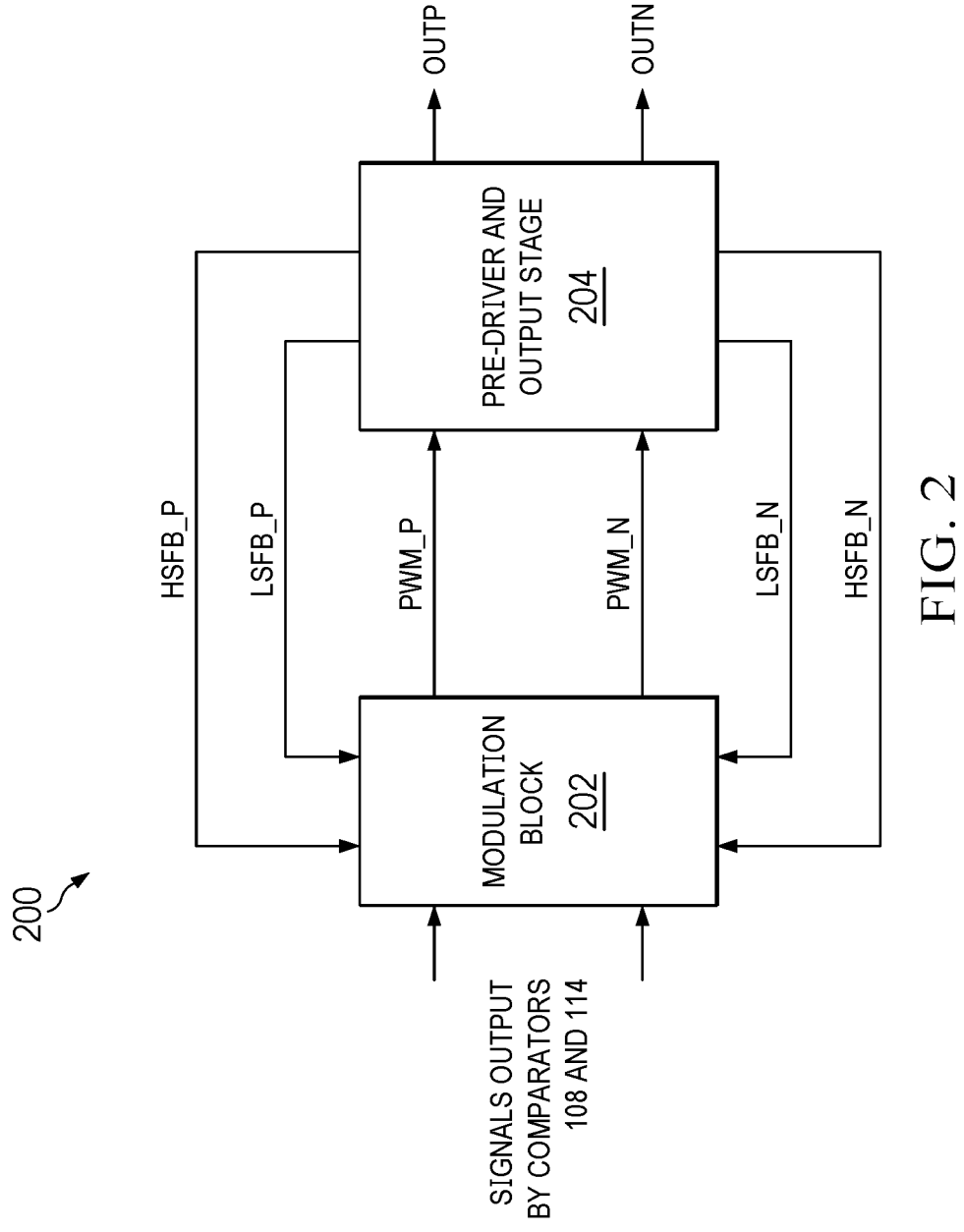
FIG. 2 is a block diagram of a modulation block and a pre-driver & output stage of an example Class-D amplifier with high-side and low-side feedback control.

FIG. 2 shows an example of such a configuration in a Class-D amplifier, denoted 200 in FIG. 2. DMAX and DMIN are typically constrained by delay elements and level shifters in pre-drivers of the output stage, as well as by the gate charging and discharging times of power field-effect transistors and their Miller plateau operating regions. Configurations and operational techniques disclosed herein provide solutions to these issues.

Although not shown in FIG. 2, Class-D amplifier 200 may include front-end components, such subtractors 102 and 104, $n^{th}$-order loop filter 106, comparators 108 and 114, as well as ramp generator 114, to process a differential input signal. The signals output by comparators 108 and 114 are input to a modulation block 202, which includes modulation circuitry. Modulation block 202 also receives the HSFB_P/N and LSFB_P/N signals from a pre-driver & output stage 204, which may include an H-bridge. Pre-driver & output stage 204 may sometimes be referred to simply as an output stage.

Figure 3:
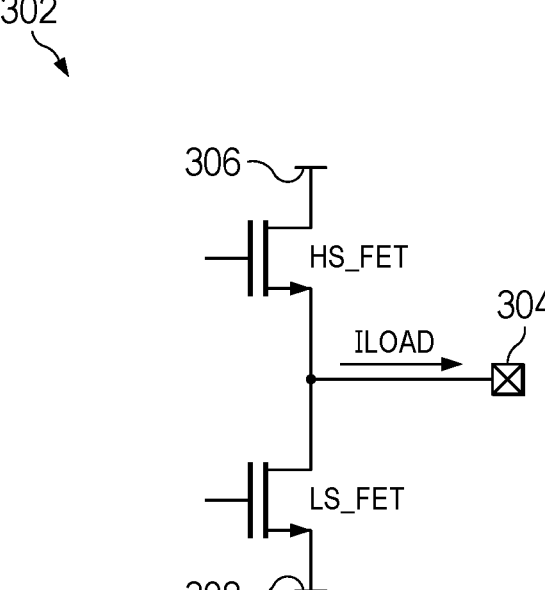
FIG. 3 presents diagrams illustrating operation of a portion of an example pre-driver & output stage of a Class-D amplifier under a first load current condition.
Figure 3:
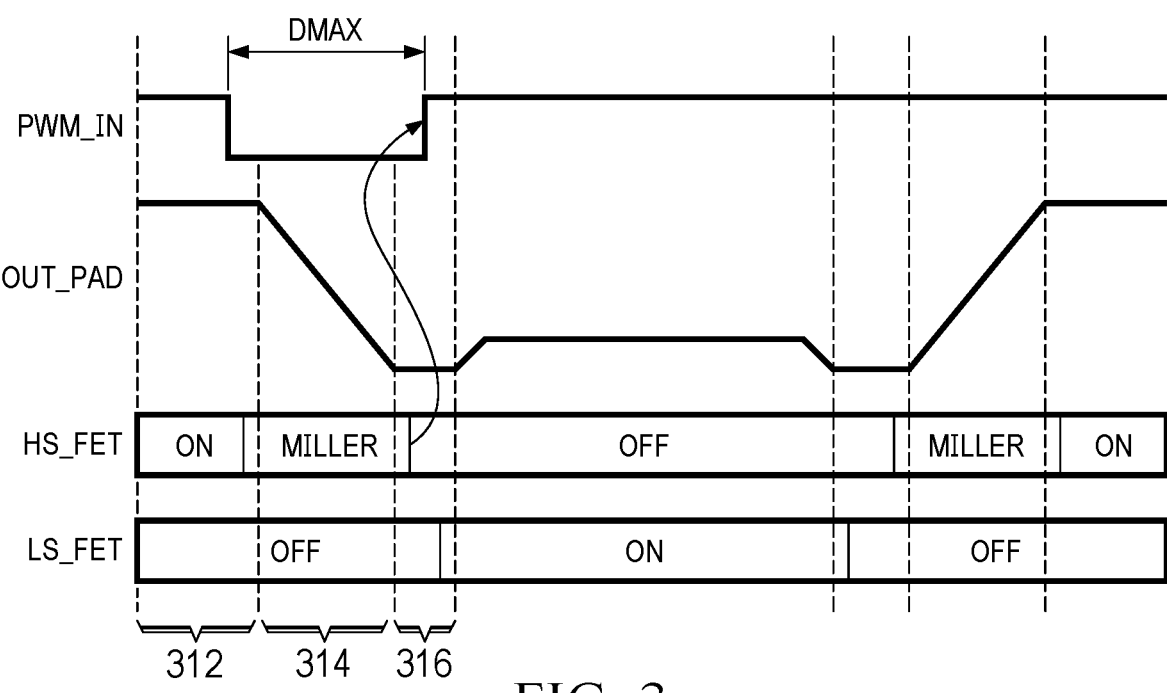

FIG. 3 shows a switching circuit 302 and a signal node 304 of pre-driver & output stage 204, and more particularly of the output stage portion of 204. Switching circuit 302 includes a high-side field-effect transistor (HS_FET) and a low-side field-effect transistor (LS_FET). In the illustrated example, both HS_FET and LS_FET are n-type FETs, in which the source of HS_FET is coupled to the drain of LS_FET, which common coupling is also coupled to signal node 304. In the illustrated example, the drain of HS_FET is coupled to a supply voltage terminal 306, and the source of LS_FET is coupled to a common potential terminal 308. Supply voltage terminal 306 may be coupled to a positive supply voltage (PVDD), and common potential terminal 308 may be coupled to ground. Switching circuit 302 includes another set of FETs 304 coupled between PVDD and ground and also having a common source-drain coupling (not shown in FIG. 3 but which are shown generally as part of the H-bridge in FIG. 1). Signal node 304 extends between these two source-drain couplings. Switching circuit 302 is configured to generate output signals (OUTP and OUTN) of amplifier 100, the pulse widths of which are adjusted as further described below. In another example, HS_FET of switching circuit 302 may be implemented with a p-type FET and LS_FET may be implemented with an n-type FET, as those skilled in the art would understand from the teachings herein.

FIG. 3 also shows a timing diagram of an input signal to output stage 204 (PWM_IN) and the signal at signal node 304 (OUT_PAD) with respect to operation of HS_FET and LS_FET when the load current (ILOAD) flows away from the source-drain coupling of HS_FET and LS_FET. In FIG. 3, PWM_IN may correspond to PWM_P. In a first time period 312, PWM_IN begins in a high state and goes to a low state before transition of OUT_PAD from a high to a low state, which transition starts at the beginning of a second time period 314. HS_FET is ON in first time period 312, transitioning to the Miller region of operation (in which the gate-to-source voltage (Vgs) of HS_FET is relatively constant) at the end of first time period 312. In second time period 314, OUT_PAD transitions to the low state, during which HS_FET operates in the Miller region. LS_FET is OFF during the first and second time periods 312 and 314. The completion of the transition of OUT_PAD to the low state is indicated by the feedback signal HSFB going low, which occurs at the beginning of third time period 316 when HS_FET exits the Miller region of operation and turns OFF, which is detected by a high-side (HS) detection circuit coupled to the gate of HS_FET. The HS detection circuit is configured to detect that the Vgs of HS_FET has dropped below a first threshold, and in response outputs HSFB. When HSFB transitions back to high, the positive edge of PWM_IN is released to set DMAX.

In the case of DMAX, HS_FET operates in the Miller region during high to low and low to high transitions of OUT_PAD, while LS_FET is OFF during each such transition. HS_FET is OFF and LS_FET is ON when OUT_PAD is at an intermediate level and during transitions to and from that level to the low state.

Figure 4:
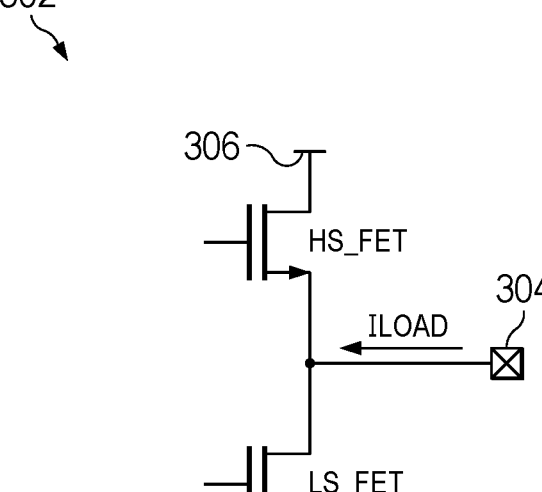
FIG. 4 presents diagrams illustrating operation of a portion of an example pre-driver & output stage of a Class-D amplifier under a second load current condition.
Figure 4:
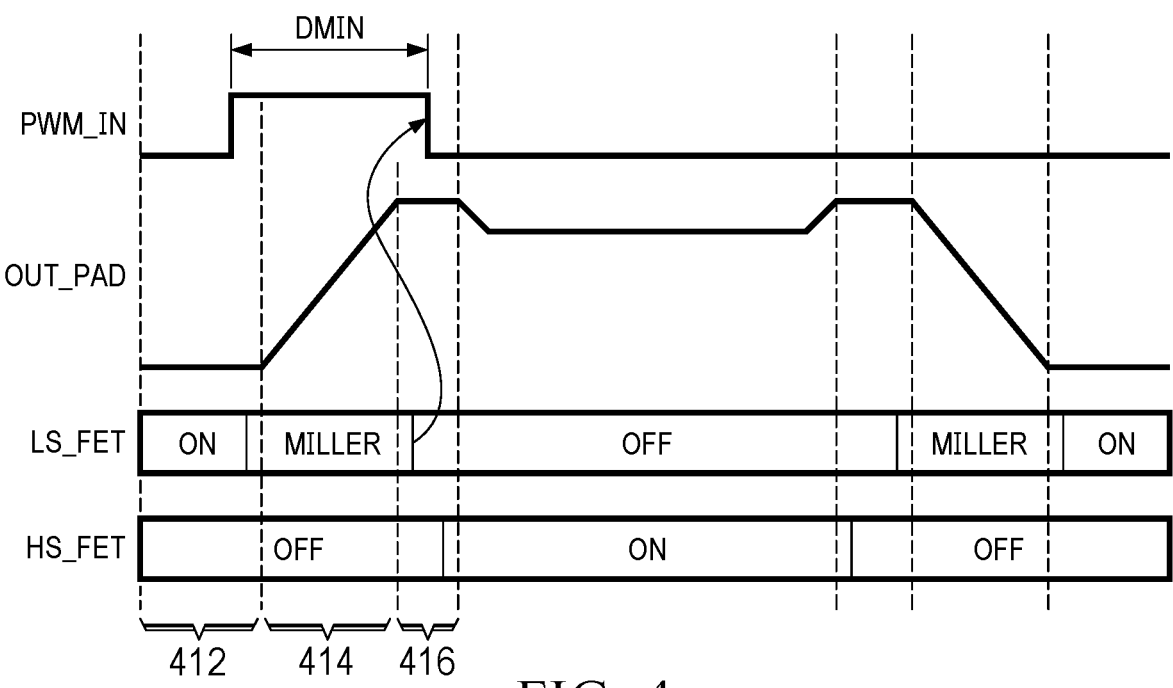

FIG. 4 shows switching circuit 302 and signal node 304 of the output stage portion of pre-driver & output stage 204, along with a timing diagram of an input signal to pre-driver & output stage 204 (PWM_IN) and the signal at signal node 304 (OUT_PAD) with respect to operation of HS_FET and LS_FET when the load current (ILOAD) flows toward the source-drain coupling of HS_FET and LS_FET. In FIG. 4, PWM_IN may correspond to PWM_N, which is input to the other side of the H-bridge.

In a first time period 412, PWM_IN begins in a low state and goes to a high state before transition of OUT_PAD from a low to a high state, which transition starts at the beginning of a second time period 414. LS_FET is ON in first time period 412, transitioning to the Miller region of operation (in which the Vgs of LS_FET is relatively constant) at the end of first time period 412. In second time period 414, OUT_PAD transitions to the high state, during which LS_FET operates in the Miller region. HS_FET is OFF during the first and second time periods 412 and 414. The completion of the transition of OUT_PAD to the high state is indicated by the feedback signal LSFB going low, which occurs at the beginning of third time period 416 when LS_FET exits the Miller region of operation and turns OFF, which is detected by a low-side (HS) detection circuit coupled to the gate of LS_FET. The LS detection circuit is configured to detect that the Vgs of LS_FET has dropped below a first threshold, and in response outputs LSFB. When LSFB transitions back to high, the negative edge of PWM_IN is released to set DMIN.

Figure 5:
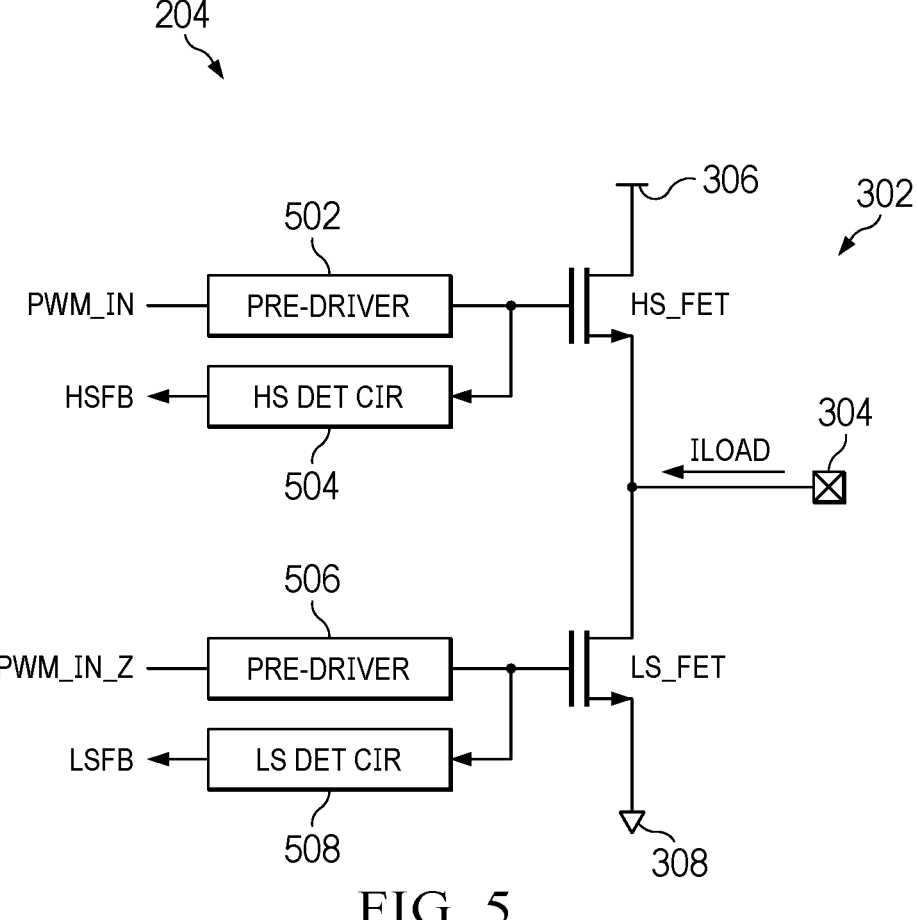
FIG. 5 is a diagram of components of an example pre-driver & output stage of a Class-D amplifier.

FIG. 5 shows an example configuration of HS and LS detection circuitry with respect to pre-drivers and switching circuit 302. A first pre-driver 502 has an input to receive PWM_IN (which may correspond to PWM_P) and an output coupled to the gate of HS_FET. Pre-driver 502 is configured to control the gate of (and thus turn ON and OFF) HS_FET in response to PWM_IN. A HS detection circuit (or HS detector) 504 is coupled to the gate of HS_FET. HS detection circuit 504 includes comparator and/or other thresholding circuitry to compare the Vgs of HS_FET to a first voltage threshold ($V_{TH1}$) and output HSFB when it is determined that Vgs<$V_{TH1}$. A second pre-driver 506 has an input to receive PWM_IN_Z, which is the complement of PWN_IN, and an output coupled to the gate of LS_FET. Pre-driver 506 is configured to control the gate of (and thus turn ON and OFF) LS_FET in response to PWM_IN_Z. A LS detection circuit (or LS detector) 508 is coupled to the gate of LS_FET. LS detection circuit 508 includes comparator and/or other thresholding circuitry to compare the Vgs of LS_FET to a second voltage threshold ($V_{TH2}$) and output LSFB when it is determined that Vgs<$V_{TH2}$. In an example, $V_{TH1}$ and $V_{TH2}$ are the same, e.g., $V_{TH}$. In an example, the outputting of each of HSFB and LSFB may be carried out by transitioning from a high state to a low state. That is, in response to detection that Vgs of HS_FET is less than $V_{TH}$, HSFB transitions from high to low, and in response to detection that Vgs of LS_FET is less than $V_{TH}$, LSFB transitions from high to low.

Figure 6:
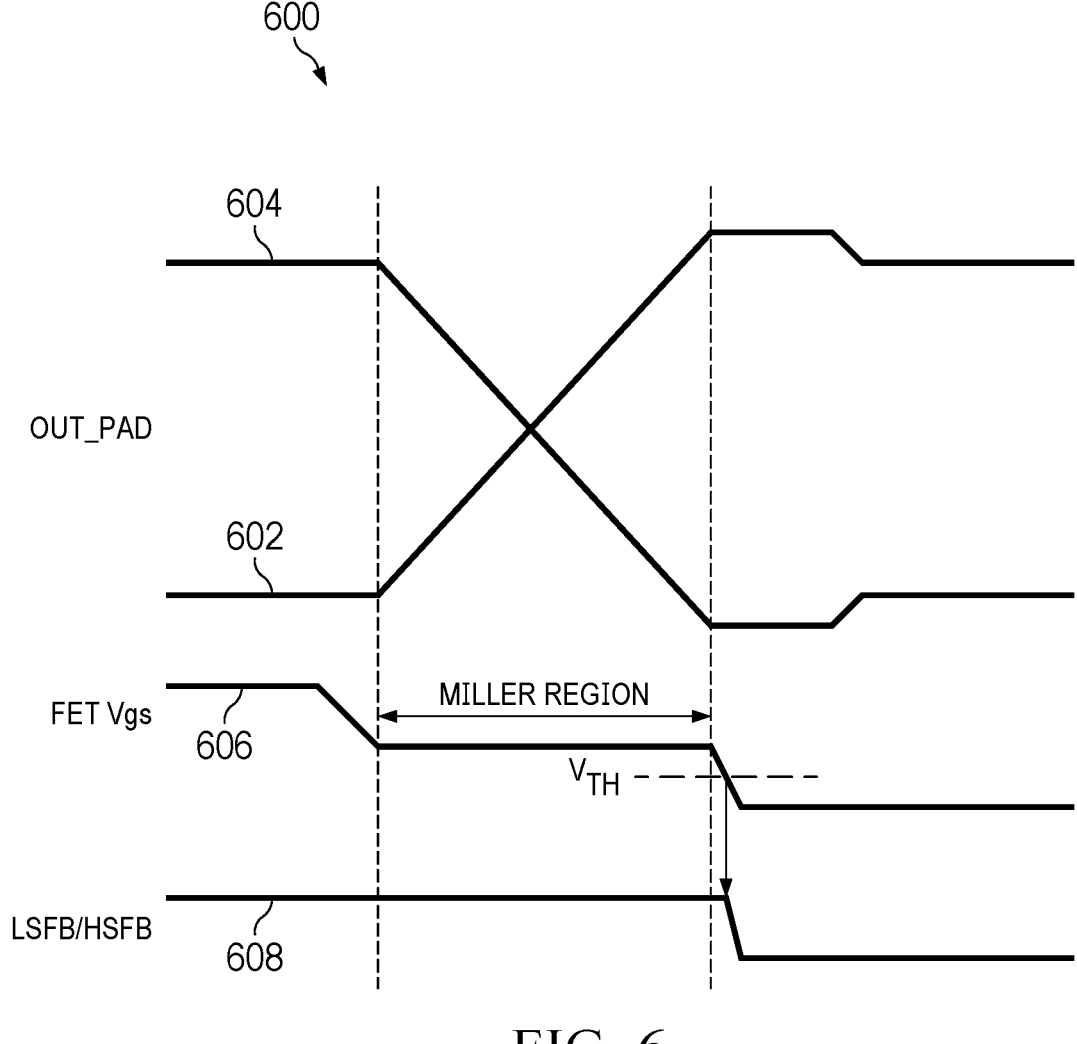
FIG. 6 is an example timing diagram illustrating signal transitions on signal node of a Class-D amplifier output stage, the gate-to-source voltage of a corresponding output transistor, and the feedback signals.

FIG. 6 is a timing diagram 600 of an example transition of LSFB/HSFB in response to change in the Vgs of the corresponding FET and aligned with transitions of OUT_PAD. A single threshold $V_{TH}$ is used; $V_{TH}$ may be set to a suitable voltage based on the range of Vgs. During the transition of OUT_PAD from low to high, shown by curve 602, HS_FET operates in the Miller region, and during the transition of OUT_PAD from high to low, shown by curve 604, LS_FET operates in the Miller region. Curve 606 shows the Vgs for each FET during with respect to its corresponding OUT_PAD transition. As curve 608 indicates, each detection circuit 504 and 508 is configured to transition its corresponding FB signal from high to low after the OUT_PAD completes its transition and the corresponding FET exits the Miller region of operation and turns OFF. This change in operation of the FET is detected by detecting that the Vgs of the FET dropped below $V_{TH}$. In response to detecting that the Vgs of the corresponding FET (HS_FET or LS_FET) has dropped below $V_{TH}$, the corresponding detection circuit (504 or 508) outputs the corresponding FB signal (HSFB or LSFB).

Figure 7:
FIG. 7 is an example timing diagram of pulse width modulated (PWM) input and output signals of an example pre-driver & output stage together with the generated high-side and low-side feedback signals used to control pulse widths of the PWM output signals.
Figure 7:
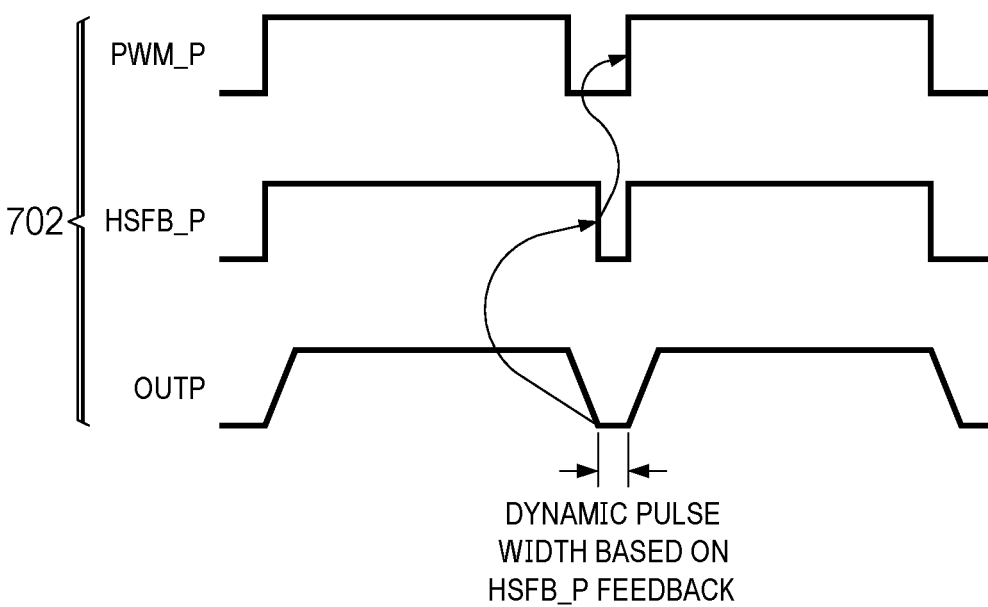
Figure 7:
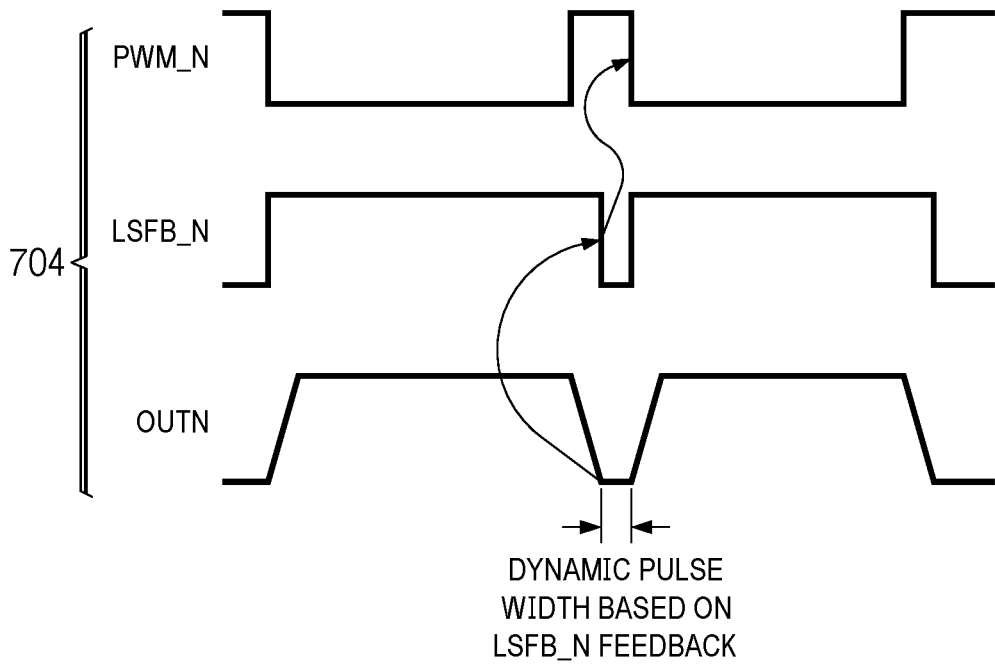

FIG. 7 shows timing diagrams for two set of signals 702 and 704, which are valid for the positive half-cycle in which OUTP has wider pulses and OUTN has narrower pulses. Set 702 includes signals PWM_P, HSFB_P and OUTP, and set 704 includes signals PWM_N, LSFB_N and OUTN. With respect to set 702, based on the transition of HSFB_P from high to low, a minimum pulse width is dynamically generated between ON periods of OUTP at high duty cycle. Similarly, with respect to set 704, based on the transition of LSFB_N from high to low, a minimum pulse width is dynamically generated between ON periods of OUTN at high duty cycle.

Three illustrative cases of adaptive DMIN and DMAX are as follows. Case 1 for DMAX at saturation in BD or LSR modulation; case 2 for DMIN at saturation in BD modulation; and case 3 for DMIN at idle channel operation in LSR modulation. In case 1, the system awaits signal fall on the signal node. The HSFB signal going low indicates that the signal transition is complete. The subsequent positive edge of the PWM input signal is released immediately after negative transition of the HSFB signal. In case 2, the system awaits signal rise on the signal node. The LSFB signal going low indicates that the signal transition is complete. The subsequent negative edge of the PWM input signal is released immediately after negative transition of the LSFB signal. In case 3, mixed transitions for both rise and fall may occur. The HSFB signal going high indicates the beginning of a transition on the signal node. The next negative edge of the PWM input signal occurs a period of time ΔT after HSFB goes high to make sure the output transition finishes. ΔT is a specific parameter that depends on edge-rate control and PVDD. ΔT is set to ensure that the system waits long enough to the let the transition on the signal node finish before the next negative edge of the PWM input signal.

Example amplifiers and components thereof ensure that DMAX and DMIN pulse widths are just wide enough to complete signal transition on the signal node to improve power delivery for any fixed voltage supply without adding significant loop filter distortion, which reduces THDN degradation. The solutions provided herein are applicable to Class-D amplifiers, as well as other types of loop-filter-based circuits.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure including one or more semiconductor elements (such as transistors), one or more passive elements (such as resistors, etc.), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Uses of the phrase "ground" in the foregoing description may be a common ground or any other form of ground connection applicable to, or suitable for, the teachings of this description. Uses of the term "terminal" may be a terminus of a circuit element or of a larger component, i.e., a device, and/or may be a node within a circuit. Unless otherwise stated, "about," "approximately," or "substantially" preceding a value means+/−10 percent of the stated value.

Modifications of the described examples are possible, as are other examples, within the scope of the claims. Moreover, features described herein may be applied in other environments and applications consistent with the teachings provided.

What is claimed is:

1. An amplifier comprising:
a high-side transistor having a control terminal, a first current terminal and a second current terminal;
a low-side transistor having a control terminal, a first current terminal and a second current terminal, the first current terminal of the low-side transistor coupled to the second current terminal of the high-side transistor;

a high-side pre-driver having a high-side output coupled to the control terminal of the high-side transistor, the high-side pre-driver configured to control the control terminal of the high-side transistor in response to a high-side feedback signal and a first input signal;
a low-side pre-driver having a low-side output coupled to the control terminal of the low-side transistor, the low-side pre-driver configured to control the control terminal of the low-side transistor in response to a low-side feedback signal and the first input signal;
a high-side detection circuit having an input coupled to the control terminal of the high-side transistor, the high-side detection circuit configured to output the high-side feedback signal; and
a low-side detection circuit having an input coupled to the control terminal of the low-side transistor, the low-side detection circuit configured to output the low-side feedback signal.

2. The amplifier of claim 1, wherein each of the high-side transistor and the low-side transistor is a field-effect transistor in which the control terminal is a gate terminal.

3. The amplifier of claim 1, wherein the high-side detection circuit is configured to detect a gate-to-source voltage (Vgs) of the high-side transistor, compare the detected Vgs to a first voltage threshold, and output the high-side feedback signal at a specific level in response to determining that the detected Vgs is less than the first voltage threshold, wherein the first voltage threshold is less than a Miller plateau voltage of the high-side transistor so that the high-side feedback signal indicates the high-side transistor exiting the Miller plateau region of the high-side transistor.

4. The amplifier of claim 3, wherein the low-side detection circuit is configured to detect a gate-to-source voltage (Vgs) of the low-side transistor, compare the detected Vgs of the low-side transistor to a second voltage threshold, and output the low-side feedback signal at a specific level in response to determining that the detected Vgs of the low-side transistor is less than the second voltage threshold, wherein the second voltage threshold is less than a Miller plateau voltage of the low-side transistor so that the low-side feedback signal indicates the low-side transistor exiting the Miller plateau region of the low-side transistor.

5. The amplifier of claim 1, further comprising:
a modulator having a first modulator input, a second modulator input, a third modulator input, and a first modulator output, the first modulator input configured to receive the high-side feedback signal, the second modulator input configured to receive the low-side feedback signal, the third modulator input configured to receive the first input signal, the first modulator output configured to output a first pulse width modulated (PWM) input signal based on the high-side feedback signal, the low-side feedback signal, and the first input signal,
the high-side pre-driver having a high-side input configured to receive the first PWM input signal, the high-side pre-driver configured to control the control terminal of the high-side transistor in response to the first PWM input signal,
the low-side pre-driver having a low-side input configured to receive the complement of the first PWM input signal, the low-side pre-driver configured to control the control terminal of the low-side transistor in response to the complement of the first PWM input signal.

6. The amplifier of claim 5, wherein the high-side transistor and the low-side transistor are configured to output a first PWM output signal in response to the first input signal, the high-side feedback signal, and the low-side feedback signal.

7. The amplifier of claim 6, wherein the modulator is configured to:

adjust a pulse width of the first PWM output signal based on the first input signal and a first component of the high-side feedback signal.

8. The amplifier of claim 7, wherein the modulator is configured to:

adjust the pulse width of the first PWM output signal based on the first input signal and a first component of the low-side feedback signal.

9. The amplifier of claim 1, wherein the high-side pre-driver is further configured to control the control terminal of the high-side transistor in response to the low-side feedback signal, and wherein the low-side pre-driver is further configured to control the control terminal of the low-side transistor in response to the high-side feedback signal.

10. The amplifier of claim 1, wherein the high-side transistor is a first high-side transistor, the low-side transistor is a first low-side transistor, the high-side pre-driver is a first high-side pre-driver, the low-side pre-driver is a first low-side pre-driver, the high-side detection circuit is a first high-side detection circuit, and the low-side detection circuit is a first low-side detection circuit, the amplifier further comprising:

a second high-side transistor having a control terminal, a first current terminal and a second current terminal;

a second low-side transistor having a control terminal, a first current terminal and a second current terminal, the first current terminal of the second low-side transistor coupled to the second current terminal of the first high-side transistor;

a second high-side pre-driver having a high-side output coupled to the control terminal of the second high-side transistor, the second high-side pre-driver configured to control the control terminal of the second high-side transistor in response to a second high-side feedback signal and a second input signal;

a second low-side pre-driver having a low-side output coupled to the control terminal of the second low-side transistor, the second low-side pre-driver configured to control the control terminal of the second low-side transistor in response to a second low-side feedback signal and the second input signal;

a second high-side detection circuit having an input coupled to the control terminal of the second high-side transistor, the second high-side detection circuit configured to output the second high-side feedback signal; and a second low-side detection circuit having an input coupled to the control terminal of the second low-side transistor, the second low-side detection circuit configured to output the second low-side feedback signal.

11. An amplifier comprising:

a modulator configured to:

receive a first input signal and a second input signal, receive a first feedback signal and a second feedback signal, output a first pulse width modulated (PWM) signal based on the first input signal and the first feedback signal, and output a second PWM signal based on the second input signal and the second feedback signal; and an output stage coupled to the modulator and configured to:

receive the first PWM signal and the second PWM signal, output a first output signal based on the first PWM signal, output a second output signal based on the second PWM signal, output the first feedback signal and adjust the first feedback signal in response to a first transistor of the output stage exiting a Miller plateau region of operation of the first transistor, and output the second feedback signal and adjust the second feedback signal in response to a second transistor of the output stage exiting a Miller plateau region of operation of the second transistor.

12. The amplifier of claim 11,
wherein the output stage is configured to detect the first transistor of the output stage exiting the Miller plateau region of operation of the first transistor by detecting when a gate-to-source voltage (Vgs) of the first transistor drops below a Miller plateau voltage of the first transistor.

13. The amplifier of claim 11,
wherein the output stage is configured to detect the second transistor of the output stage exiting the Miller plateau region of operation of the second transistor by detecting when a gate-to-source voltage (Vgs) of the second transistor drops below a Miller plateau voltage of the second transistor.

14. The amplifier of claim 11,
the modulator further configured to:

receive a third feedback signal and a fourth feedback signal, output the first PWM signal further based on the third feedback signal, and output the second PWM signal further based on the fourth feedback signal, the output stage further configured to:

output the third feedback signal and adjust the third feedback signal in response to a third transistor of the output stage exiting a Miller plateau region of operation of the third transistor, and output the fourth feedback signal and adjust the fourth feedback signal in response to a fourth transistor of the output stage exiting a Miller plateau region of operation of the fourth transistor.

15. A method comprising:

detecting that a gate-to-source voltage (Vgs) of a transistor of an output stage of an amplifier is less than a voltage threshold in response to a pulse width modulated (PWM) signal input to the output stage;

outputting a feedback signal at a specific level in response to detecting that the Vgs of the transistor is less than the voltage threshold; and adjusting a pulse width of a PWM output signal of the amplifier in response to the feedback signal, wherein the voltage threshold is set based on a Miller plateau voltage of the transistor.

16. The method of claim 15, wherein the feedback signal is outputted at a high level prior to detecting that the Vgs of the transistor of the output stage is less than the voltage threshold and is outputted at a low level in response to detecting that the Vgs of the transistor of the output stage is less than the voltage threshold.

17. The method of claim 15, wherein the transistor is a first transistor, the output stage includes a second transistor, the PWM signal input is a first PWM signal input, the feedback signal is a first feedback signal, the PWM output signal is a first PWM output signal, and each low pulse width of the first PWM output signal is adjusted, the method further comprising:

detecting that a gate-to-source voltage (Vgs) of the second transistor is less than the voltage threshold in response to a second PWM signal input to the output stage;

outputting a second feedback signal at a specific level in response to detecting that the Vgs of the second transistor is less than the voltage threshold; and adjusting each high pulse width of a second PWM output signal of the amplifier in response to second feedback signal.

18. The method of claim 15, further comprising:

operating the transistor in the Miller plateau region during a signal transition at an output of the output stage before outputting the feedback signal at the specific level, the outputting of the feedback signal at the specific level being indicative of completion of the signal transition.

19. The method of claim 15, wherein the voltage threshold is less than the Miller plateau voltage of the transistor such that the feedback signal indicates the transistor exiting the Miller plateau region of the transistor.

20. The method of claim 15, wherein the pulse width of the PWM output signal is adjusted by controlling the gate of the transistor based on the feedback signal.

\* \* \* \* \*